United States Patent [19]

Takemae et al.

[11] Patent Number: 4,583,204

[45] Date of Patent: Apr. 15, 1986

[54] SEMICONDUCTOR MEMORY DEVICE

[75] Inventors: Yoshihiro Takemae, Yokohama; Shigeki Nozaki; Tsuyoshi Ohira, both of Kawasaki, all of Japan

[73] Assignee: Fujitsu Limited, Kawasaki, Japan

[21] Appl. No.: 452,436

[22] Filed: Dec. 23, 1982

[30] Foreign Application Priority Data

Dec. 26, 1981 [JP] Japan .............................. 56-212934

[51] Int. Cl.[4] ............................................ G11C 11/24
[52] U.S. Cl. .................................. 365/226; 365/189; 365/230
[58] Field of Search ................ 365/189, 226, 230, 233

[56] References Cited

U.S. PATENT DOCUMENTS 4,385,369  5/1983  Sheppard ........................ 365/230 X

*Primary Examiner*—Joseph A. Popek
*Attorney, Agent, or Firm*—Staas & Halsey

[57] ABSTRACT

A dynamic semiconductor memory device includes data output lines (D, $\bar{D}$), a data output buffer (12), a column enable buffer (9), and an output enable buffer (11) for generating an output enable signal (OE) to enable the transmission of data from the data output lines to the data buffer. The output enable buffer is driven by the clock signals of the column enable buffer. An output disabling circuit (13) is provided to stop the generation of an output enable signal by the output enable buffer when the output enable buffer is not being driven by the column enable buffer. As a result, the data output buffer assumes a high-impedance state when a power supply is turned on.

10 Claims, 10 Drawing Figures

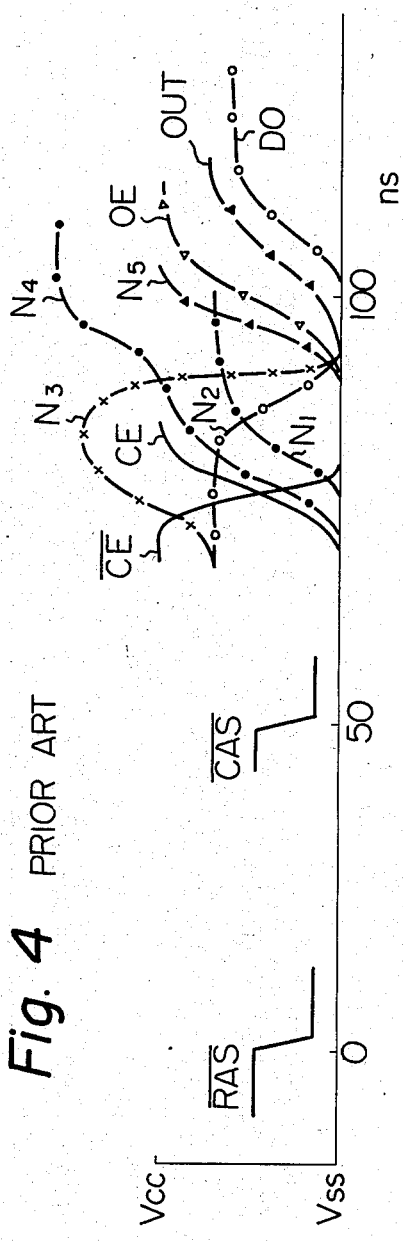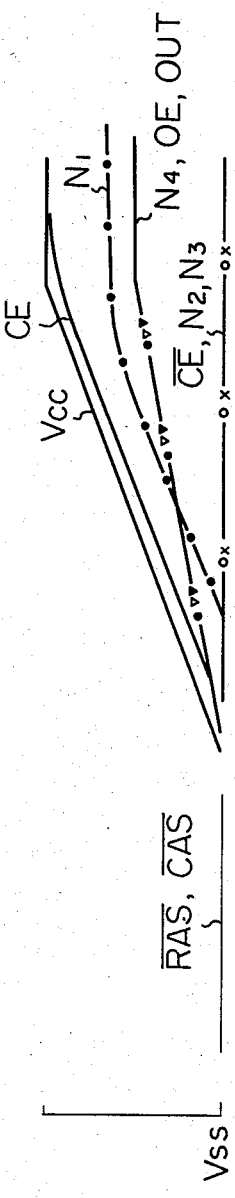
Fig. 4 PRIOR ART
Fig. 5 PRIOR ART

SEMICONDUCTOR MEMORY DEVICE

BACKGROUND OF THE INVENTION

1. Field of the Invention

The present invention relates to a semiconductor memory device. More particularly, it relates to the data output portion thereof.

2. Description of the Prior Art

It is well known that a large memory system can be constructed utilizing a plurality of semiconductor memory devices (integrated circuits) arranged in rows and columns, for example, a memory system constructed with 4 rows × 8 columns, so as to perform an 8-bit parallel data processing operation. In such a case, the data output terminals of the memory devices arranged in each column are connected to a common data bus.

In the above-mentioned memory system, however, when the system is in a transient state and the power supply is turned on, two or more memory devices in one column may assume a read-mode state. If this happens, a large short-circuit current flows from one memory device to another memory device through a data bus, possibly damaging the output transistors of the data output portion and disconnecting the aluminum connections of the output transistors.

SUMMARY OF THE INVENTION

It is an object of the present invention to provide a semiconductor memory device for use in the above-mentioned memory system in which no short-circuit current is generated when the power supply is turned on.

According to the present invention, when the power supply is turned on, the output transistors are forced to assume a high-impedance state, and thereby no short-circuit current flows therethrough.

The semiconductor memory device of the present invention includes data output lines, a data output buffer, a column enable buffer, and an output enable buffer for generating an output enable signal to enable the transmission of data from the data output lines to the data buffer. The output enable buffer is driven by the clock signals of the column enable buffer. An output disabling circuit is provided to stop the generation of an output enable signal by the output enable buffer when the output enable buffer is not being driven by the column enable buffer. As a result, the data output buffer assumes a high-impedance state when a power supply is turned on.

The present invention will be clearly understood from the description as set forth below contrasting the present invention with the prior art and referring to the accompanying drawings.

BRIEF DESCRIPTION OF THE DRAWINGS

FIGS. 4 and 5 are timing diagrams of the operation of the circuit of FIG. 3;

DESCRIPTION OF THE PREFERRED EMBODIMENTS

Figure 1:
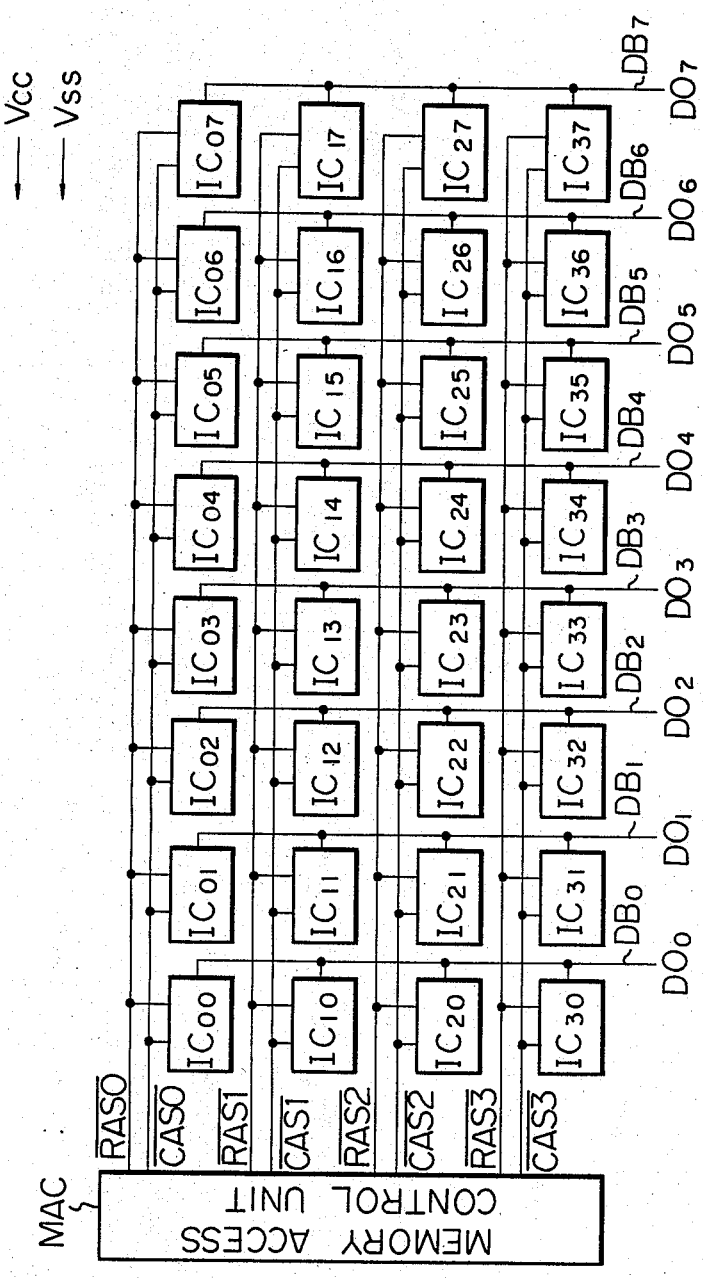
FIG. 1 is a block circuit diagram of a general memory system.

In FIG. 1, $IC_{00}$, $IC_{01}$, ..., $IC_{07}$, $IC_{10}$, $IC_{11}$, ..., $IC_{17}$, $IC_{20}$, $IC_{21}$, ..., $IC_{27}$, and $IC_{30}$, $IC_{31}$, ..., $IC_{37}$ designate 64K dynamic random-access memory (RAM) devices. That is, 4×8 memory devices form four groups, and each group is controlled by a memory access control unit MAC. $DB_0$, $DB_1$, ..., and $DB_7$ designate data buses, and $DO_0$, $DO_1$, ..., and $DO_7$ designate eight pieces of parallel data. Other signals, such as address signals and a write enable signal (WE), are not shown.

In the read mode, when the memory access control unit MAC makes a row address strobe signal RAS0 low, each of the memory devices $IC_{00}$, $IC_{01}$, ..., and $IC_{07}$ takes in a row address. Next, when the memory access control unit MAC makes a column address strobe signal CAS0 low, each of the memory devices $IC_{00}$, $IC_{01}$, ..., and $IC_{07}$ takes in a column address. As a result, memory data $DO_0$, $DO_1$, ..., and $DO_7$ of the memory cells of the devices $IC_{00}$, $IC_{01}$, ..., and $IC_{07}$ designated by the above-mentioned row and column addresses is read out of the data buses $DB_0$, $DB_1$, ..., and $DB_7$. Similarly, when the memory access control unit MAC makes a row address strobe signal $\overline{RAS1}$ low and then makes a column address strobe signal $\overline{CAS1}$ low, memory data $DO_0$, $DO_1$, ..., and $DO_7$ of the memory cells of the devices $IC_{10}$, $IC_{11}$, ..., and $IC_{17}$ is read out of the data buses $DB_0$, $DB_1$, ..., and $DB_7$.

Figure 2:
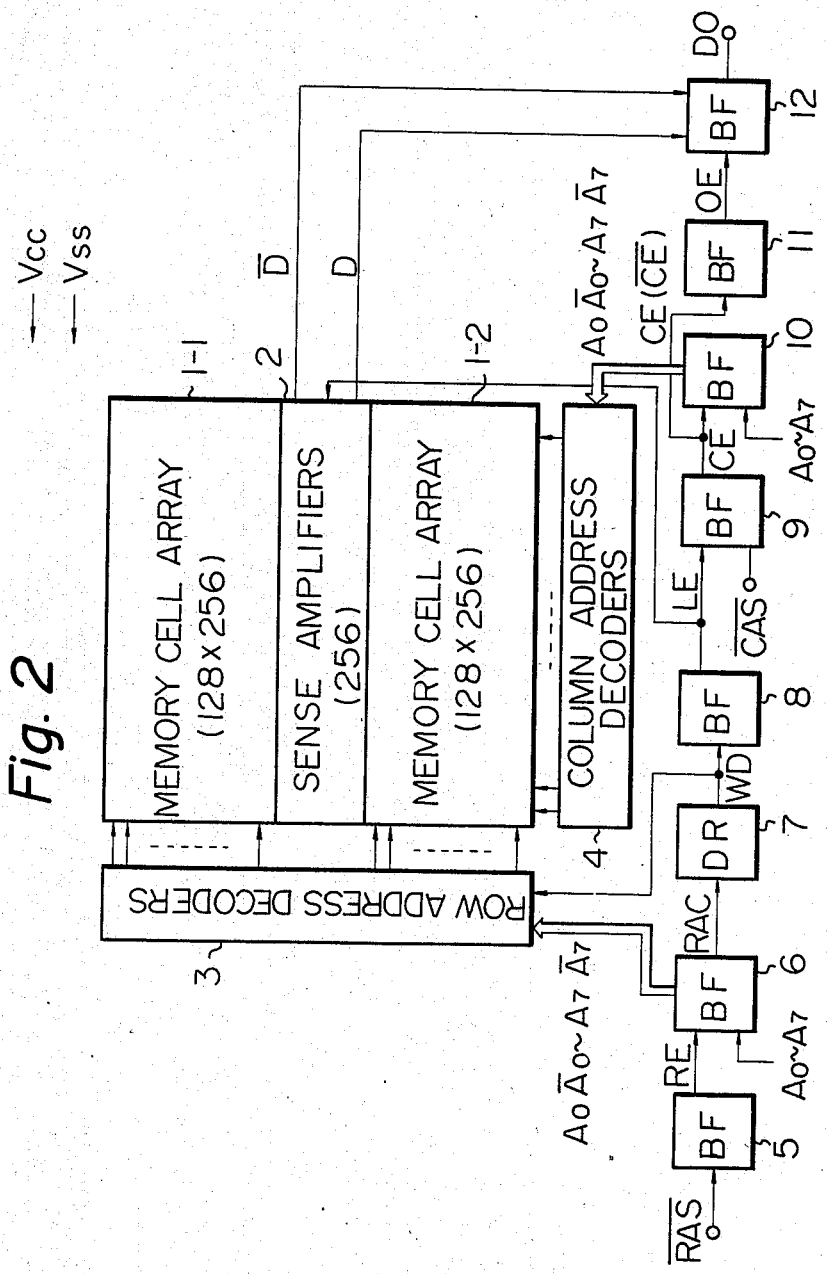
FIG. 2 is a block circuit diagram of one of the semiconductor memory devices of FIG. 1.

In FIG. 2, which is one of the memory devices $IC_{00}$, $IC_{01}$, ... of FIG. 1, reference numerals 1—1 and 1—2 designate memory cell arrays, each array including 32 kbit (128×256) memory cells; 2 designates a series of 256 sense amplifiers between the memory cell arrays 1—1 and 1—2; 3 designates row address decoders including word drivers; and 4 designates column address decoders. The row address decoders 3 select one of 256 rows specified by a logic combination of the row address signals $A_0$ and $\overline{A_0}$ through $A_7$ and $\overline{A_7}$. In this case, the word drivers of the row address decoders 3 are clocked by a word line-driving signal WD.

The row address decoders 3 which select one of the 256 rows are controlled by a row enable buffer 5, a row address buffer 6, and a word line driver 7. In more detail, the row enable buffer 5 converts a row address signal $\overline{RAS}$ of a transistor-transistor logic (TTL) level from the exterior of the device into a row enable signal RE of a metal-oxide semiconductor (MOS) level. In an access mode, such as the read mode, the row address buffer 6 converts the row address signals $A_0$ through $A_7$ of a TTL level from the exterior of the device into the row address signals $A_0$, $\overline{A_0}$ through $A_7$, $\overline{A_7}$ of a MOS level. This conversion is clocked by the row enable signal RE transmitted from the row enable buffer 5. Simultaneously, the row address buffer 6 receives the row enable signal RE so as to generate a row address clock signal RAC. The word line driver 7 receives the row address clock signal RAC so as to generate a word line-driving signal WD. As a result, all of the word drivers included in the row address decoders 3 are clocked. A latch enable buffer 8 receives the word line-driving signal WD so as to generate a latch enable signal LE. As a result, all of the sense amplifiers 2 are activated.

One of the 256 columns is selected by a column enable buffer 9 and a column address buffer 10. In more detail, the column enable buffer 9 receives the latch enable signal LE and a column address strobe signal $\overline{CAS}$ from the exterior of the device and generates a column enable signal CE. Therefore, this column selection is performed after row selection. Next, the column address buffer 10 converts the column address signals $A_0$ through $A_7$ of a TTL level from the exterior of the device into the column address signals $A_0$, $\overline{A}_0$ through $A_7$, $\overline{A}_7$ of a MOS level so that the column address decoders 4 select one of the 256 columns. This conversion is clocked by the column enable signal CE transmitted from the column enable buffer 9.

Reference numeral 11 designates a data output enable buffer which is driven or clocked by the column enable signal CE and its inverted signal $\overline{CE}$ to generate an output enable signal OE which is transmitted to a data output buffer 12. The data output buffer 12 transmits data read out of the sense amplifiers 2 as output data DO through data output lines D and $\overline{D}$ to the exterior of the device.

The present invention relates to an improvement of the data output portion, that is, the data output enable buffer 11 and the data output buffer 12, of FIG. 2, which will now be explained in more detail.

Figure 3:
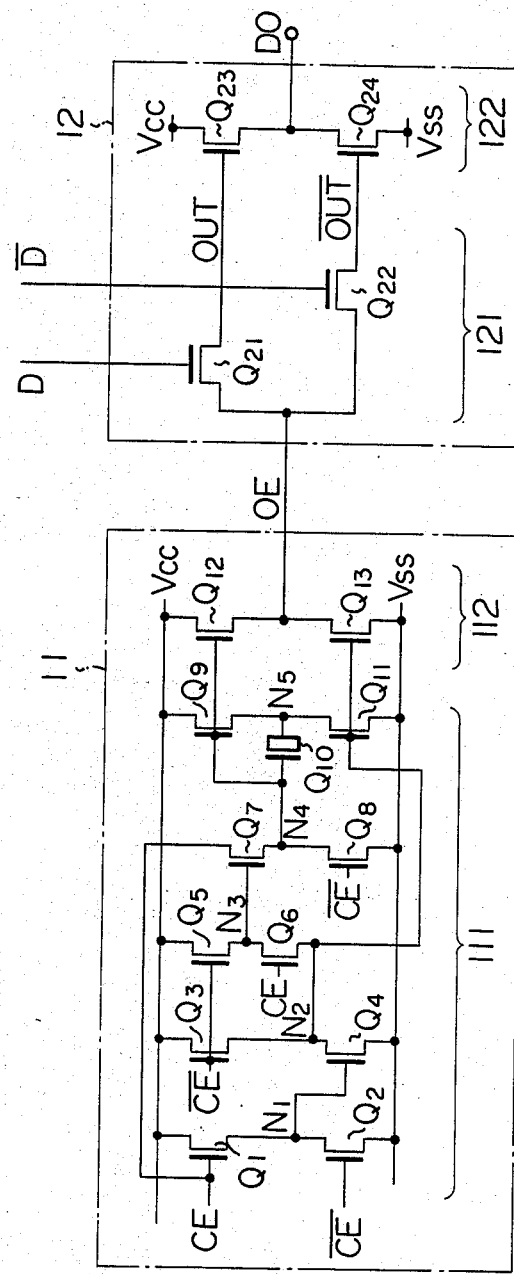
FIG. 3 is a circuit diagram of a prior art data output portion.

In FIG. 3, which is a prior art data output portion circuit, the data output enable buffer 11 comprises a bootstrap circuit 111, driven or clocked by the column enable signals CE and $\overline{CE}$, and an output enable signal-generating circuit 112 for generating an output enable signal OE to the data output buffer 12. $N_4$ is a node boosted by the bootstrap circuit 111. The data output buffer 12 comprises a data transfer circuit 121 connected to the data output lines D and $\overline{D}$ and to the output enable signal-generating circuit 112 and a data output circuit 122.

The normal operation of the circuit of FIG. 3 is now explained with reference to FIG. 4. Assume that the power supply voltage $V_{cc}$ remains at a normal value. When the row address strobe signal $\overline{RAS}$ and the column address strobe signal $\overline{CAS}$ both remain at a high level, the column enable signals CE and $\overline{CE}$ are low ($V_{ss}$) and high ($V_{cc}$), respectively. Therefore, in the bootstrap circuit 111, the transistors $Q_2$, $Q_3$, $Q_5$, $Q_8$ and $Q_{11}$ are turned on and the others are turned off. As a result, the potential at the nodes $N_1$, $N_4$ and $N_5$ remains low ($V_{ss}$) while the potential at the other nodes remains high ($V_{cc} - V_{th}$). In order to perform a read operation, when the row address signal $\overline{RAS}$ is caused to be low and then the column address signal $\overline{CAS}$ is caused to be low, the potential of the column enable signal $\overline{CE}$ is changed from low ($V_{ss}$) to high ($V_{cc}$) while the potential of the column enable signal $\overline{CE}$ is changed from high ($V_{cc}$) to low ($V_{ss}$). As a result, the potential at the node $N_3$ is pushed up by the capacitive coupling of the gate and drain of the transistor $Q_7$. In addition, the transistor $Q_1$ is turned on, with the result that the potential at the node $N_1$ is increased so as to turn on the transistor $Q_4$, which, in turn, decreases the potential at the node $N_2$. Further, since the transistor $Q_7$ is turned on due to the high potential at the node $N_3$, the potential at the node $N_4$ rises in accordance with a rise in the potential of the signal CE. As the potential at the node $N_2$ decreases, the transistors $Q_{11}$ and $Q_{13}$ are turned off, and, in addition, the potential at the node $N_3$ falls. Finally, the transistor $Q_7$ is turned off, with the result that the node $N_4$ assumes a floating state. When the node $N_4$ is in a floating state, the conductive transistor $Q_9$ pushes up the potential at the node $N_5$, and the potential at the node $N_4$ is further pushed up, due to the bootstrap effect, by the MOS capacitor $Q_{10}$. As a result, the transistors $Q_9$ and $Q_{12}$ are completely turned on and thereby the potential of the output enable signal OE reaches $V_{cc}$.

In the data output buffer 12, assume that the potentials of the data output lines D and $\overline{D}$ are high ($V_{cc}$) and low ($V_{ss}$), respectively. In such a case, the transistors $Q_{21}$ and $Q_{22}$ are turned on and off, respectively. Therefore, the potential of the data OUT rises in accordance with a rise in the potential of the output enable signal OE and reaches $V_{cc} - V_{th}$ while the potential of the data $\overline{OUT}$ remains low ($V_{ss}$). As a result, the transistors $Q_{23}$ and $Q_{24}$ are turned on and off, respectively and thereby, high level data having a potential $V_{cc} - 2V_{th}$ is obtained as the output data DO. However, when the potentials of the data output lines D and $\overline{D}$ are low ($V_{ss}$) and high ($V_{cc}$), respectively, low level data having a potential $V_{ss}$ is obtained as the output data DO. This is the normal operation of the circuit of FIG. 3.

Next, the transient or abnormal operation of the circuit of FIG. 3, is explained with reference to FIG. 5. Assume that the signals $\overline{RAS}$ and $\overline{CAS}$ both remain low ($V_{ss}$) and, in addition, that the power supply $V_{cc}$ is turned on, that is, that the potential $V_{cc}$ is gradually increased. In this case, the potential of the column enable signal CE rises in accordance with a rise in the potential $V_{cc}$ due to the capacitive coupling of the gate and drain of the transistor $Q_1$. The rise of the potential of the signal CE turns on the transistor $Q_1$, with the result that the potential at the node $N_1$ rises in accordance with a rise in the potential of the signal CE. However, the potential of the signal $\overline{CE}$ remains low ($V_{ss}$). As a result, the transistor $Q_4$ is turned on so that the potential at the node $N_2$ also remains low ($V_{ss}$). Therefore, the transistors $Q_{11}$ and $Q_{13}$ are completely turned off. In addition, since the signal CE is transmitted to the gate of the transistor $Q_6$, the transistor $Q_6$ is turned on, with the result that the potential at the node $N_3$ also remains low ($V_{ss}$). As a result, the transistor $Q_7$ is turned off. On the other hand, since the signal $\overline{CE}$ is transmitted to the gate of the transistor $Q_8$, the transistor $Q_8$ is also turned off. Therefore, the node $N_4$ is in a floating state. In this state, as the potential $V_{cc}$ increases, the potential at the node $N_4$ also increases due to the capacitive coupling of the gate and drain of the transistor $Q_9$. Further, the potential of the output enable signal OE also increases due to the capacitive coupling of the gate and source of the transistor $Q_{12}$.

In the above-mentioned state, however, if the potential of the data output line D is high and the potential of the data output line $\overline{D}$ is low, or vice versa, which may often occur in a transient state where the power supply is turned on, the potential of the output data DO may be high or low in accordance with the condition of the output data lines D and $\overline{D}$. Such a phenomenon causes a serious problem in the memory system of FIG. 1 since, for example, the memory devices $IC_{00}$, $IC_{10}$, $IC_{20}$, and $IC_{30}$ are connected to a common data bus. This serious problem is explained with reference to FIG. 6.

Figure 6:
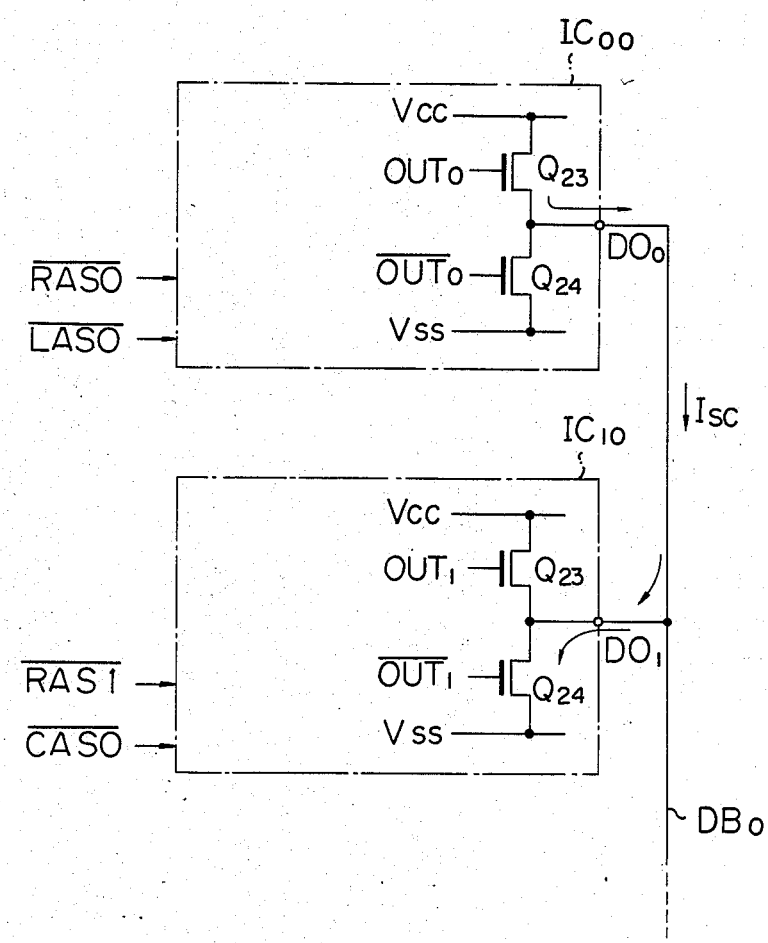
FIG. 6 is a circuit diagram of a problem in the memory system of FIG. 1 utilizing the prior art circuit of FIG. 3.

In FIG. 6, the memory devices $IC_{00}$ and $IC_{10}$ are commonly connected to the data bus $DB_0$. In a transient state when the power supply $V_{cc}$ is turned on, the signals $\overline{RAS0}$, $\overline{CAS0}$, $\overline{RAS1}$, and $\overline{CAS1}$ are not stationary. That is, the potentials thereof are determined in accordance with the sequence of turning on the power supplies, including the power supply $V_{cc}$, the fluctuation of the characteristics of each memory device, and the like. Therefore, at worst, the potentials of the signals $\overline{RAS0}$, $\overline{CAS0}$, $\overline{RAS1}$, and $\overline{CAS1}$ become low. As a result, both the output transistor $Q_{23}$ of the memory device $IC_{00}$ and the output transistor $Q_{24}$ of the memory device $IC_{10}$ may be turned on, thereby causing a large DC short-circuit current $I_{SC}$ to flow through both of the transistors.

Note that, usually each output transistor has the capacity to supply a current of about 100 mA to the data bus $DB_0$, which has a capacity of about 100 pF. Therefore, in a normal operation, only an AC current flows through each output transistor.

The above-mentioned DC short-circuit current $I_{SC}$ may cause the output transistors to be damaged and may cause the aluminum connections within the memory devices to be disconnected.

In the present invention, when the power supply $V_{cc}$ is turned on, the generation of an output enable signal OE is stopped in order for the data output buffer, that is, the output transistors, to assume a high-impedance state.

Figure 7:
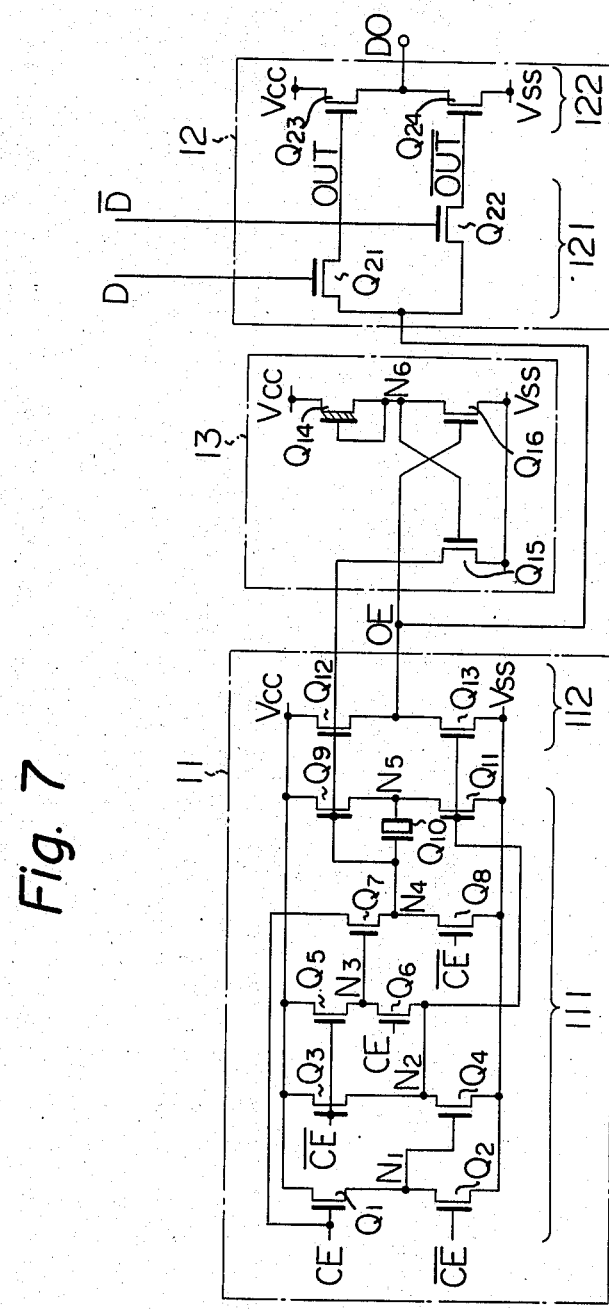
FIGS. 7 and 8 are circuit diagrams of embodiments of the data output portion of the semiconductor memory device according to the present invention.

In FIG. 7, which is an embodiment of the present invention, an output disabling circuit 13 is added to the circuit of FIG. 3. The output disabling circuit 13 comprises a depletion-type transistor $Q_{14}$ and two enhancement-type transistors $Q_{15}$ and $Q_{16}$. The transistor $Q_{15}$ is connected to the bootstraped node $N_4$ of the bootstrap circuit 111. In addition, the transistor $Q_{16}$ is connected via the transistor $Q_{14}$, which serves as a load, to the power supply $V_{cc}$.

Figure 8:
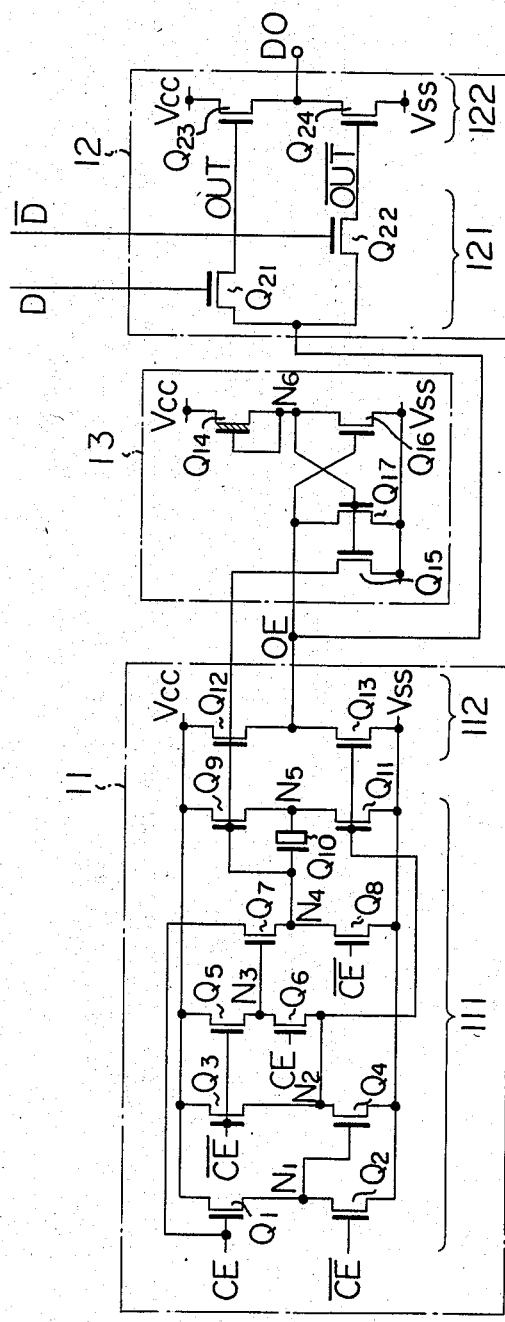

In FIG. 8, which is another embodiment of the present invention, a transistor $Q_{17}$ is added to the output disable circuit of FIG. 7.

Figure 9:
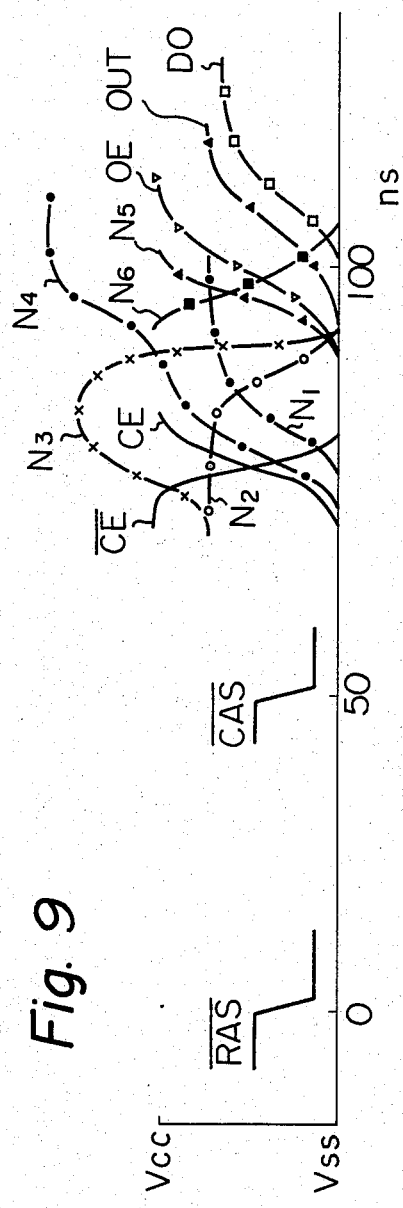
FIGS. 9 and 10 are timing diagrams of the operation of the circuits of FIGS. 7 and 8.

The normal operation of the circuit of FIGS. 7 and 8 is now explained with reference to FIG. 9. In the same way as in FIG. 4, when the signals RAS and CAS, respectively, are generated, a row address and a column address are input. After that, the pushing up of the potential at the node $N_3$, the rising of the potential at the nodes $N_1$ and $N_4$, the falling of the potential at the node $N_2$, and the rising of the potential at the node $N_5$ occur.

In the output disabling circuit 13, the potential at the node $N_6$ is increased to the power supply voltage $V_{cc}$ due to the load transistor $Q_{14}$. Accordingly, at first, the potential at the node $N_6$ remains high $(V_{cc})$. When the potential at the node $N_6$ remains high, although the transistors $Q_{15}$ and $Q_{17}$ are turned on and the transistor $Q_{16}$ is turned off, the transistors $Q_{15}$ and $Q_{17}$ cannot prevent the potential at the bootstrapped node $N_4$ and the potential of the output enable signal OE from rising. The reason for this is that the driving power of the transistors $Q_{15}$ and $Q_{17}$ is small. Therefore, when the potential of the output enable signal OE becomes sufficiently high, the transistor $Q_{16}$ is turned on to decrease the potential at the node $N_6$. As a result, the transistors $Q_{15}$ and $Q_{17}$ are turned off. Thus, the output enable signal OE can serve as a power supply for the data output buffer 12. That is, in a normal state or a stationary state, the presence of the output disabling circuit 13 presents no obstacle in the operation of the output enable buffer 11.

Figure 10:
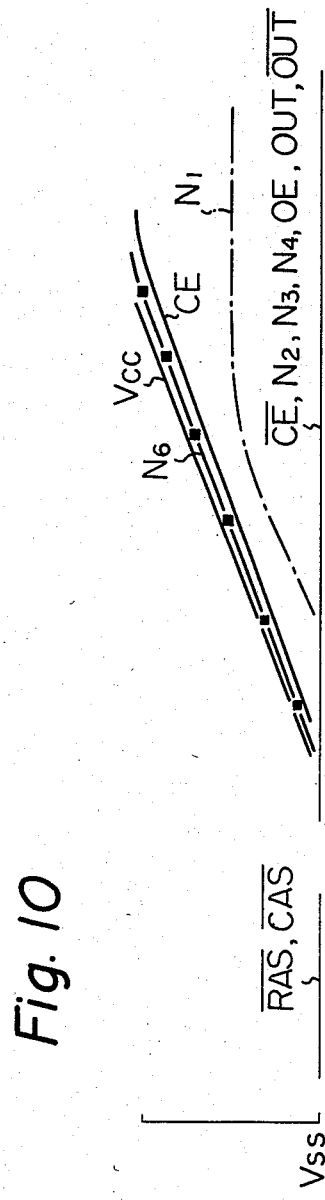

Next, the transient or abnormal operation of the circuit of FIGS. 7 and 8 is explained with reference to FIG. 10. Assume that the signals $\overline{RAS}$ and $\overline{CAS}$ both remain low $(V_{ss})$ and, in addition, that the power supply $V_{cc}$ is turned on, that is, that the potential $V_{cc}$ is gradually increased. In this case, the potential of the column enable signal CE rises in accordance with a rise in the potential $V_{cc}$ due to the capacitive coupling of the gate and drain of the transistor $Q_1$. In the output disabling circuit 13, the potential at the node $N_6$ definitely rises in accordance with a rise in the potential $V_{cc}$ due to the presence of the depletion-type transistor $Q_{14}$ so as to turn on the transistor $Q_{15}$ and turn off the transistor $Q_{16}$. In the output enable buffer 11, the rising of the signal CE turns on the transistors $Q_1$ and $Q_6$ while the transistors $Q_2$, $Q_3$, $Q_5$, and $Q_8$ remain in the off state since the potential of the signal $\overline{CE}$ remains low $(V_{ss})$. The rising of the potential of the signal CE turns on the transistor $Q_1$, with the result that the potential at the node $N_1$ rises in accordance with a rise in the potential of the signal CE. However, the potential at the node $N_2$ does not change since it is already low before the transistor $Q_4$ is turned on. Also, the potential at the node $N_3$ does not change, that is, it remains low $(V_{ss})$.

Although the potential at the node $N_4$ would normally rise, due to the capacitive coupling of the gate and drain of the transistor $Q_9$, in the same manner as the potential of the signal CE, in this case, it does not rise since the transistor $Q_{15}$ of the output disabling circuit 13 is turned on. Therefore, the transistors $Q_9$ and $Q_{12}$ are turned off, and the potential at the node $N_5$ and the potential of the output enable signal OE do not rise. Further, in FIG. 8, the transistor $Q_{17}$ prevents the signal OE from rising.

In the data output buffer 12, since the potential of the output enable signal OE is low $(V_{ss})$, the potential of the data $\overline{OUT}$ and the data OUT is low $(V_{ss})$ regardless of the potential of the output data lines D and $\overline{D}$. As a result, the transistors $Q_{23}$ and $Q_{24}$ are both turned off, and, accordingly, the terminal for the output data DO assumes a high-impedance state. Therefore, if a plurality of memory devices using the circuits of FIG. 7 or 8 are combined to form a memory system as is illustrated in FIG. 1, no short-circuit curent $I_{SC}$ flows therethrough.

In order to definitely raise the potential at the node $N_6$ when the power supply $V_{cc}$ is turned on, it is necessary that the threshold voltage of the transistor $Q_{16}$ be higher than that of the transistor $Q_{17}$.

In order to perform a memory access operation such as a read operation, it is necessary to make the signals $\overline{RAS}$ and $\overline{CAS}$ high in advance, i.e., to carry out a so-called stand-by operation. In the stand-by mode, the potentials of the signals CE and $\overline{CE}$ are low $(V_{ss})$ and high $(V_{cc})$, respectively, so that the transistors $Q_2$, $Q_3$, $Q_5$, and $Q_8$ are turned on and the transistors $Q_1$ and $Q_6$ are turned off. As a result, the potential at the node $N_1$ is low so as to turn off the transistor $Q_4$ while the potential at the node $N_2$ is high $(V_{cc}-V_{th})$ so as to turn on the transistors $Q_{11}$ and $Q_{13}$. In addition, the potential at the node $N_3$ is high $(V_{cc}-V_{th})$ so as to charge the node $N_4$. Thus, the stand-by operation in preparation for a bootstrap operation and the like is completed. Then the signals $\overline{RAS}$ and $\overline{CAS}$, respectively, are made low $(V_{ss})$, and the operaton illustrated in FIG. 8 and FIG. 9 begins.

In a dynamic RAM, even when the power supply is turned on, the potential at each portion has a tendency to fall toward $V_{ss}$, due to a junction leak or the like, even if no memory operation is performed. Therefore, in a memory system using the prior art circuit of FIG. 3, the state for generating a short-circuit current does not continue for a long time. That is, after several seconds or several milliseconds have passed, the potential at each terminal for data DO₁ and DO₂, shown in FIG. 6, becomes low, and, accordingly, the above-mentioned short-circuit current is extinguished. However, it should be noted that several seconds or several milliseconds during which a state for generating a short-circuit exists is a considerably long time in the case of a dynamic RAM which operates on the order of nanoseconds (nsec). Therefore, in the prior art, it is important that the power supply be turned on only when the signals $\overline{RAS}$ and $\overline{CAS}$ are high. However, according to the present invention, such a limitation is unnecessary.

As was explained hereinbefore, according to the present invention, in a memory system having a plurality of memory devices arranged in rows and columns, a short-circuit current is not generated when a power supply is turned on.

We claim:

1. A semiconductor memory device operatively connected to receive clock signals, comprising:
   a first power supply having a potential;
   a second power supply, the potential of said second power supply being higher than the potential of said first power supply;
   an output enable circuit connected to said first and second power supplies and operatively connected to receive the clock signals, for generating an output enable signal, said output enable circuit comprising:
   a bootstrap circuit; and
   a signal generating circuit operatively connected to said bootstrap circuit, having an output terminal; and
   a disabling circuit, operatively connected to said first and second power supplies and to said output enable circuit, for disabling the generation of said output enable signal when said output enable circuit is not being driven by the clock signals.

2. A semiconductor memory device as set forth in claim 1, further comprising:
   data output lines for providing data signals;
   a data output buffer, operatively connected to said first and second power supplies, said data output lines and said output enable circuit, for receiving the data signals and the output enable signal and generating a data output signal; and
   a data output terminal operatively connected to receive the data output signal.

3. A device as set forth in claim 2, wherein said data buffer comprises:
   a data output circuit, operatively connected to said first and second power supplies and said data output terminal;
   a data transfer circuit, operatively connected to said data output lines, said data output circuit, and said signal-generating circuit, for transferring data from said data output lines to said data output circuit upon receipt of said output enable signal.

4. A device as set forth in claim 3, wherein said data output lines have first and second data having first and second data signals, respectively and wherein said data transfer circuit comprises:
   a first enhancement-type transistor having a drain operatively connected to said output terminal of said signal-generating circuit, having a gate operatively connected to one of said data output lines for receiving the first data signal, and having a source operatively connected to said data transfer circuit; and
   a second enhancement-type transistor having a drain operatively connected to said output terminal of said signal-generating circuit, having a gate operatively connected to another of said data output lines for receiving the second data signal, and having a source operatively connected to said data transfer circuit.

5. A device as set forth in claim 3, wherein said data transfer circuit outputs first and second output signals and wherein said data output circuit comprises first and second enhancement-type transistors operatively connected in series at a connection point between said first and second power supplies and controlled by said first and second output signals of said data transfer circuit, respectively, the connection point of said first and second enhancement-type transistors being operatively connected to said output terminal.

6. A semiconductor memory device as set forth in claim 1, wherein said bootstrap circuit has a bootstrap node and wherein said disabling circuit comprises:
   a load connected to said first power supply;
   a first enhancement-type transistor having a drain operatively connected to said bootstrap node of said bootstrap circuit, a gate operatively connected to said load, and a source operatively connected to said second power supply; and
   a second enhancement-type transistor having a drain operatively connected to said load, a gate operatively connected to said output terminal of said signal-generating circuit, and a source operatively connected to said second power supply.

7. A device as set forth in claim 6, wherein said disabling circuit further comprises a third enhancement-type transistor having a drain operatively connected to said output terminal of said signal-generating circuit and a gate operatively connected to said load.

8. A device as set forth in claim 7, wherein said load comprises a depletion-type transistor having a drain operatively connected to said first power supply, a source operatively connected to said gate of said third enhancement-type transistor, and a gate operatively connected to said source thereof.

9. A device as set forth in claim 6, wherein said disabling circuit further comprises a third enhancement-type transistor having a drain operatively connected to said output terminal, a source operatively connected to said second power supply and a gate operatively connected to said load and said gate of said first enhancement type transistor.

10. A device as set forth in claim 6, wherein said load comprises a depletion-type transistor having a drain operatively connected to said first power supply, having a source operatively connected to said gate of said first enhancement-type transistor, and having a gate operatively connected to said source of said depletion-type transistor.

* * * * *